United States Patent
Kobayashi

(10) Patent No.: US 9,215,836 B2
(45) Date of Patent: Dec. 15, 2015

(54) PRINTED CIRCUIT BOARD PRODUCTION APPARATUS AND PRINTING MACHINE

(75) Inventor: Motoki Kobayashi, Shizuoka (JP)

(73) Assignee: YAMAHA HATSUDOKI KABUSHIKI KAISHA, Shizuoka-ken (JP)

( * ) Notice: Subject to any disclaimer, the term of this patent is extended or adjusted under 35 U.S.C. 154(b) by 468 days.

(21) Appl. No.: 13/444,614

(22) Filed: Apr. 11, 2012

(65) Prior Publication Data

US 2012/0285377 A1    Nov. 15, 2012

(30) Foreign Application Priority Data

May 11, 2011 (JP) .................. 2011-106220

(51) Int. Cl.
| | |
|---|---|
| *B41F 15/08* | (2006.01) |
| *B41F 15/36* | (2006.01) |
| *B41F 15/42* | (2006.01) |
| *B05C 17/08* | (2006.01) |
| *H05K 3/12* | (2006.01) |
| *H05K 13/00* | (2006.01) |
| *H05K 13/04* | (2006.01) |
| *H05K 3/00* | (2006.01) |

(52) U.S. Cl.
CPC ............ *H05K 13/0061* (2013.01); *B41F 15/08* (2013.01); *H05K 3/1216* (2013.01); *H05K 13/0465* (2013.01); *B41F 15/0818* (2013.01); *H05K 3/0097* (2013.01)

(58) Field of Classification Search
None
See application file for complete search history.

(56) References Cited

U.S. PATENT DOCUMENTS

| | | | | |
|---|---|---|---|---|
| 5,176,078 A | * | 1/1993 | Homma et al. | ............... 101/126 |
| 2010/0242755 A1 | * | 9/2010 | Nagao | ........................... 101/126 |
| 2011/0239878 A1 | * | 10/2011 | Miyahara et al. | ............. 101/114 |

FOREIGN PATENT DOCUMENTS

| | | |
|---|---|---|
| EP | 1 185 156 A1 | 3/2002 |
| JP | 2010-251450 A | 11/2010 |
| WO | 2009/035136 A1 | 3/2009 |
| WO | 2010/070801 A1 | 6/2010 |

OTHER PUBLICATIONS

The extended European Search Report dated Dec. 11, 2012, which corresponds to EP Patent Application No./Patent No. 12002775.0-1232/2523539 and is related to U.S. Appl. No. 13/444,614.

* cited by examiner

*Primary Examiner* — Laura Edwards
*Assistant Examiner* — Binu Thomas
(74) *Attorney, Agent, or Firm* — Studebaker & Brackett PC

(57) ABSTRACT

Disclosed is a printed circuit board production apparatus which comprises a first working unit, a second working unit, and a control section. The first working unit includes a board conveying section, and a working mechanism section for subjecting the board conveyed to a given working process, wherein the board conveying section and the working mechanism section are configured to be relatively displaceable between a machine-setup position where a gap defined between the board conveying section and the working mechanism section and leading to the second working unit becomes equal to or less than a given value, and a position where the gap becomes greater than the given value. The board conveying section and the working mechanism section are arranged in the machine-setup position by the control section when machine setup for the first working unit is performed during operation of the second working unit.

9 Claims, 10 Drawing Sheets

PRINTED CIRCUIT BOARD PRODUCTION APPARATUS AND PRINTING MACHINE

BACKGROUND OF THE INVENTION

1. Field of the Invention

The present invention relates to a printed circuit board production apparatus and a printing machine, and more particularly to a printed circuit board production apparatus and a printing machine of the type having a plurality of working units.

2. Background Art

Heretofore, as a printed circuit board production apparatus having a plurality of working units, there has been known a component mounting apparatus (printed circuit board production apparatus) having two mounting units (working units), as disclosed, for example, in JP 2010-251450A.

Specifically, a component mounting apparatus disclosed in the JP 2010-251450A comprises: two mounting units each provided with a board conveying path (board conveying section) and a mounting head; and a detachable partition member provided between the two mounting units to separate respective working spaces of the mounting units from each other.

In this component mounting apparatus, when the working spaces of the two working units are separated from each other by the partition member, one of the working units cannot be moved into and operated within the working space of the other working unit. On the other hand, when the working spaces of the two working units are not separated from each other, one of the working units can be moved into and operated within the working space of the other working unit, so that it becomes possible to enhance the flexibility in working mode.

The above component mounting apparatus is configured such that, when the working spaces are separated from each other by the partition member, machine setup for one of the mounting units can be performed even during operation of the other mounting unit, whereas, when the working spaces are not separated from each other, the operations of both of the mounting units are stopped during machine setup for either one of the mounting units. As just described, in the above component mounting apparatus, when the partition member is not attached, the operations of both of the mounting units are stopped during the machine setup for one of the mounting units, because, in this state, an operating region of the other mounting unit will be exposed to the outside.

In this type of conventional component mounting apparatus, as mentioned above, when the working spaces of the two mounting units are not separated from each other, although it becomes possible to enhance the flexibility in working mode, the operations of both of the mounting units are stopped during the machine setup for either one of the mounting units, which causes a problem of deterioration in production efficiency.

SUMMARY OF THE INVENTION

It is an object of the present invention to provide a printed circuit board production apparatus and a printing machine of the type having a plurality of working units, which are capable of suppressing deterioration in production efficiency during machine setup for any one of the working units, while enhancing the flexibility in working mode.

According to one aspect of the present invention, there is provided a printed circuit board production apparatus which comprises a first working unit, a second working unit disposed adjacent to the first working unit, and a control section for controlling an operation of the first working unit. The first working unit includes a board conveying section for conveying a board, and a working mechanism section for subjecting the board conveyed by the board conveying section to a given working process, wherein the board conveying section and the working mechanism section are configured to be relatively displaceable between a machine-setup position where a gap defined between the board conveying section and the working mechanism section and leading to the second working unit becomes equal to or less than a given value, and a position where the gap becomes greater than the given value. The control section is operable, when machine setup for the first working unit is performed during operation of the second working unit, to displace at least one of the board conveying section and the working mechanism section to allow the board conveying section and the working mechanism section to be arranged in the machine-setup position.

DETAILED DESCRIPTION OF THE PREFERRED EMBODIMENTS OF THE INVENTION

The present invention will now be described based on the drawings illustrating an embodiment thereof.

With reference to FIGS. 1 to 7, a configuration of a printing machine 100 according to one embodiment of the present invention will first be described.

The printing machine 100 according to this embodiment comprises a first printing unit 1 disposes on one side in a front-back direction (Y direction) (on a side in an Y1 direction), and a second printing unit 2 disposes on the other side (on a side in an Y2 direction). The first printing unit 1 and the second printing unit 2 are disposed adjacent to each other in the front-back direction (Y direction). Each of the first printing unit 1 and the second printing unit 2 has a function of subjecting a board (bare board) to a solder printing process. In this embodiment, each of the first printing unit 1 and the second printing unit 2 serves as one example of a respective one of "first working unit" and "second working unit" set forth in the appended claims.

Figure 2:
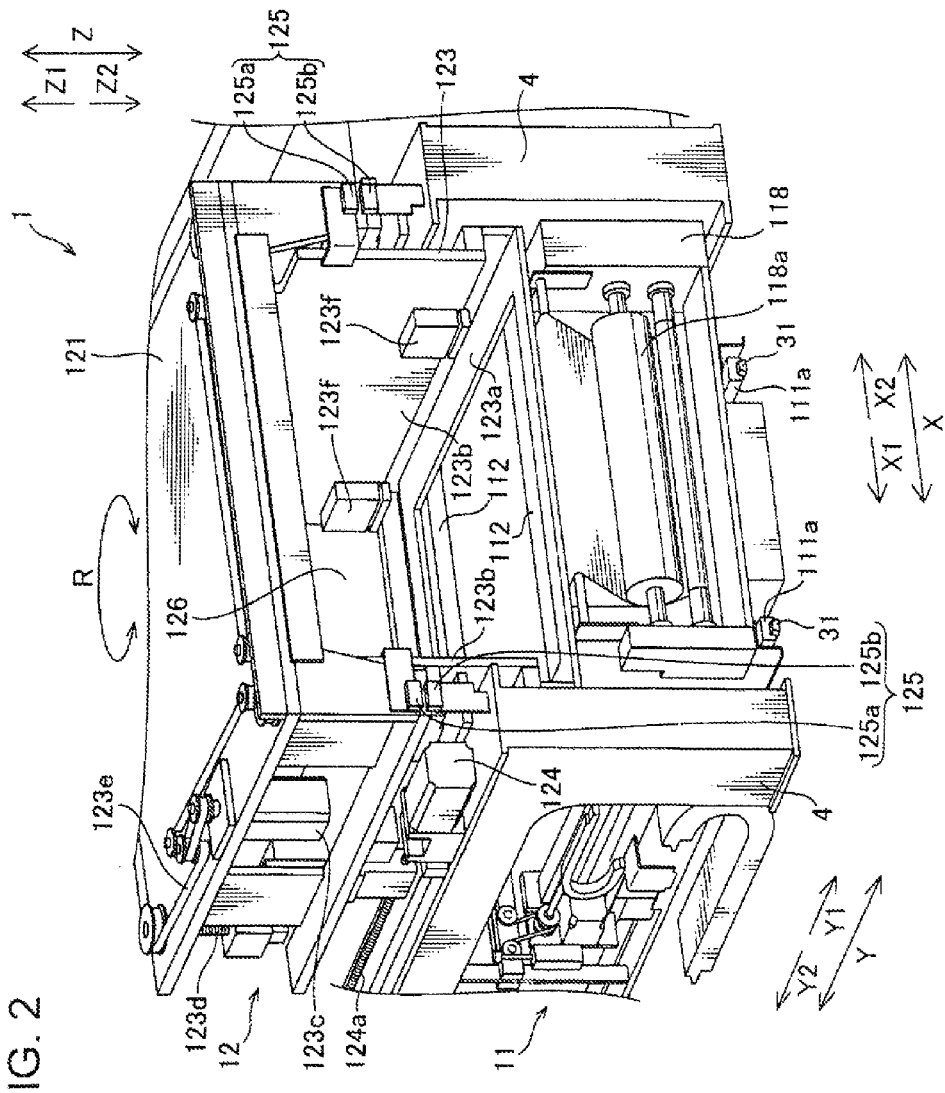
FIG. 2 is a perspective view illustrating an inside of a first printing unit of the printing machine according to the embodiment.
Figure 3:
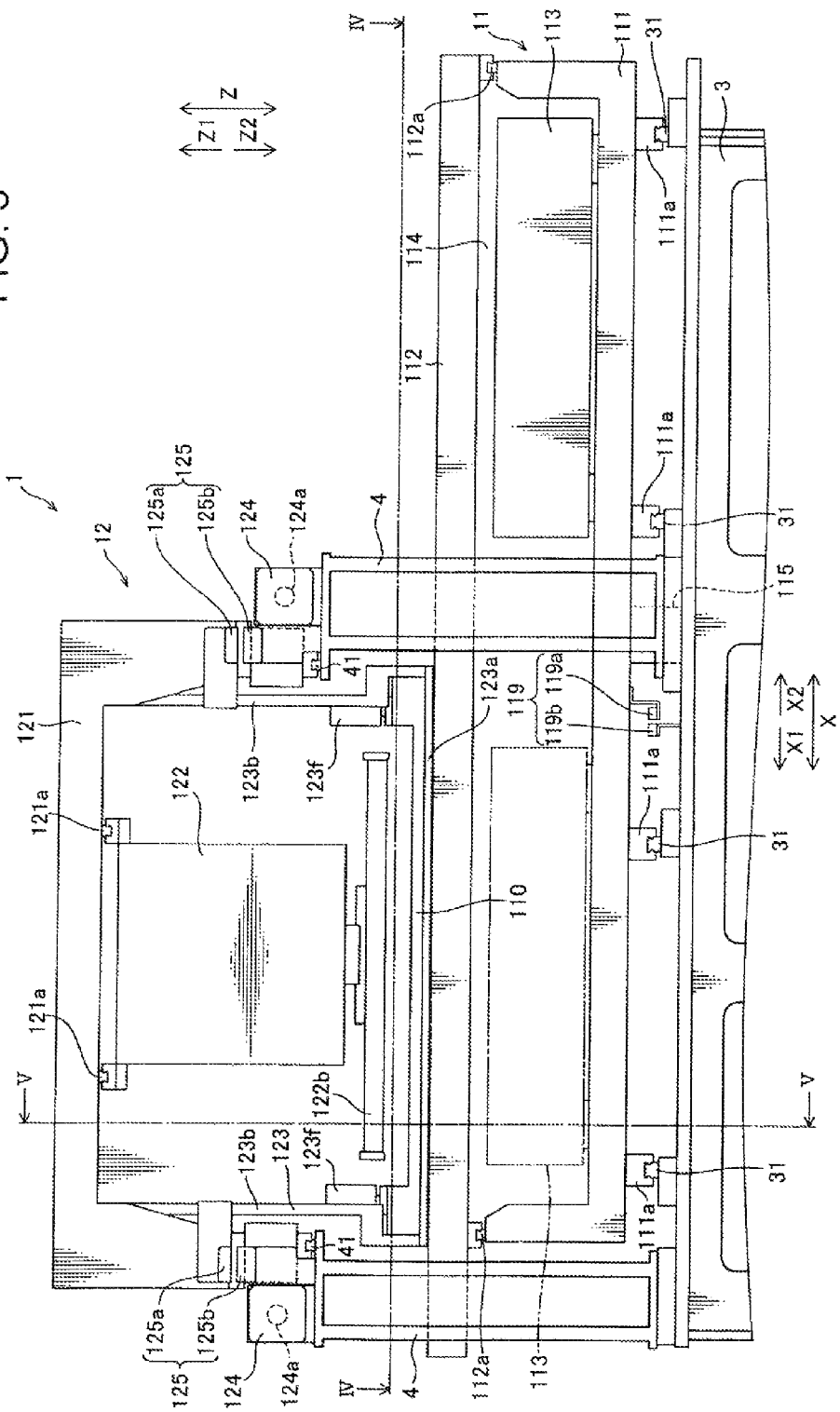
FIG. 3 is a front view illustrating the inside of the first printing unit of the printing machine according to the embodiment.

As illustrated in FIGS. 2 and 3, the first printing unit 1 comprises a board conveying section 11, and a printing mechanism section 12 disposed above the board conveying section 11. As with the first printing unit 1, the second printing unit 2 comprises a board conveying section 21 and a printing mechanism section 22 (see FIG. 6). In this embodiment, each of the first printing unit 1 and the second printing unit 2 has the same configuration. Thus, in the following description, only the configuration of the first printing unit 1 will be described in detail, and a detailed description about the configuration of the second printing unit 2 will be omitted. In this embodiment, the printing mechanism section 12 serves as one example of "working mechanism section" set forth in the appended claims.

Figure 4:
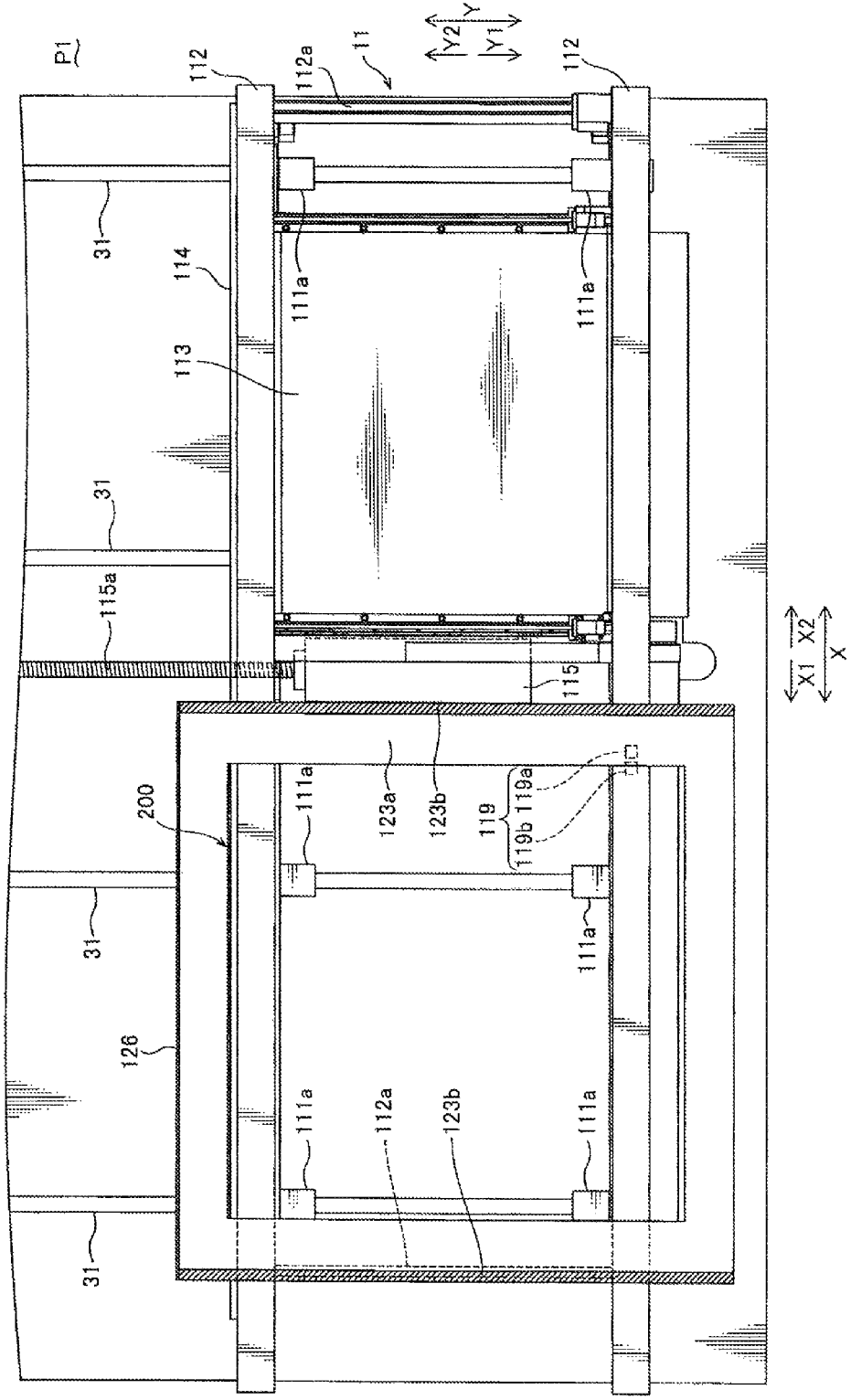
FIG. 4 is a fragmentary sectional view taken along the line IV-IV in FIG. 3.

As illustrated in FIGS. 3 and 4, the board conveying section 11 includes a conveying-section body 111 (see FIG. 3), a pair of conveyers 112 each extending in an X direction, a support table 113 (see FIGS. 3 and 4) for supporting a board, and a conveying-section cover 114 which covers one side of the board conveying section 11 facing to the second printing unit 2 (in the Y2 direction). Each of the pair of conveyers 112 and the support table 113 is supported by the conveying-section body 111. The conveying-section body 111 is supported by a base 3 displaceably in the front-back direction (Y direction) through the medium of four rails 31 each extending in the Y direction. Specifically, the conveying-section body 111 is provided with four sliders 111a engaged with respective ones of the rails 31 slidably in the Y direction. The conveying-section body 111 is configured to be driven by a Y-shaft driving device 115 composed of a servomotor. The Y-shaft driving device 115 is configured to rotationally drive a ball screw shaft 115a (see FIG. 4) extending in the Y direction. Thus, the board conveying section 11 is configured such that it is linearly displaced in the Y direction as the ball screw shaft 115a is rotationally driven. Concurrently, the pair of conveyers 112 and the support table 113 each supported by the conveying-section body 111 are displaced in the Y direction along the rails 31 together with the conveying-section body 111. The rails 31 provided on the base 3 are additionally used for the second printing unit 2. In other words, the board conveying section 21 is configured to be displaceable in the Y direction along the rails 31.

The pair of conveyers 112 have a function of conveying a board fed from an upstream side of the first printing unit 1 (from a side in an X2 direction), to a position where the board is supported by the support table 113, and conveying the solder-printed board toward a downstream side of the first printing unit 1 (in an X1 direction). The pair of conveyers 112 are configured such that a distance therebetween can be changed depending on a width of a board. Specifically, one of the conveyers 112 on a frontward side (a side in the Y1 direction) is configured to be displaced in the Y direction by a displaceable-conveyer driving device 116 (see FIG. 6), along two rails 112a provided on the conveying-section body 111. Thus, the one conveyer 112 on the frontward side (the side in the Y1 direction) can be displaced close to or away from the other conveyer 112 on a backward side (a side in the Y2 direction), so that the pair of conveyers 112 become capable of coping with a plurality of types of boards having different widths.

The support table 113 is configured to support a board through the medium of a non-illustrated support pin. The support table 113 is also configured to be relatively displaced in the X direction with respect to the conveying-section body 111 by a table driving device 117 (see FIG. 6). More specifically, the support table 113 is configured to support and lock a board conveyed from the upstream side of the first printing unit 1 (from the side in the X2 direction), in a board locking position (position indicated by the solid line), and then undergo displacement to a printing position (position indicated by the two-dot chain line) while supporting the board, as illustrated in FIG. 3. The support table 113 is further configured to release the support of the solder-printed board after completion of the solder printing process, and then undergo displacement from the printing position to the board locking position so as to support the next board.

As illustrated in FIG. 2, a cleaning device 118 is provided on the frontward side (the side in the Y1 direction) of the board conveying section 11 to clean a mask 110. The cleaning device 118 has a function of scraping away solder adhered to the mask 110 (see FIG. 3) by a cleaning sheet 1118a, so as to clean the mask 110.

Further, as illustrated in FIGS. 3 and 4, a position sensor 119 composed of a magnetic sensor is provided below the board conveying section 11. The position sensor 119 is made up of two elements, wherein one element 119a is fixedly attached to the conveying-section body 111, and the other element 119b is fixedly attached to the base 3. The position sensor 119 is operable to detect that the board conveying section 11 is located in an aftermentioned machine-setup position. In this embodiment, the position sensor 119 serves as one example of "second sensing section" set forth in the appended claims.

As illustrated in FIGS. 2 and 3, the printing mechanism section 12 includes a mechanism-section body 121, a printing segment 122 (see FIG. 3), and a mask support segment 123 which supports the mask 110 (see FIG. 3). The mechanism-section body 121 supports the printing segment 122 and the mask support segment 123 in a hanging manner. The mechanism-section body 121 is supported by two support frames 4 on the base 3, through the medium of two rails 41 (see FIG. 3) each extending in the Y direction. The two support frames 4 are formed to extend in the Y direction in top plan view, in such a manner that they also support a mechanism-section body of the second printing unit 2. As illustrated in FIGS. 2 and 3, the mechanism-section body 121 is configured to be displaced horizontally according to drivings of two Y-shaft driving devices 124 each composed of a servomotor. Specifically, the two Y-shaft driving devices 124 are disposed, respectively, on X-directionally opposite sides of the mechanism-section body 121, and each of the two Y-shaft driving devices 124 is provided with a ball screw shaft 124a extending in the Y direction. Further, the ball screw shafts 124a are screwingly attached to the mechanism-section body 121 at respective positions adjacent to X-directionally opposite ends thereof. Thus, when respective driving amounts of the two Y-shaft driving devices 124 are set to the same value, the X-directionally opposite ends of the mechanism-section body 121 are displaced in the Y direction by the same distance, so that the mechanism-section body 121 is linearly displaced in the Y direction along the rails 41. On the other hand, when the driving amounts of the two Y-shaft driving devices 124 are set, respectively, to different values, the X-directionally opposite ends of the mechanism-section body 121 are displaced, respectively, by different distances, so that the mechanism-section body 121 is rotated in an R direction (see FIG. 2) in a horizontal plane. In this embodiment, the mask support segment 123 serves as one example of "displaceable segment" set forth in the appended claims. Further, the Y-shaft driving device 124 serves as one example of "driving source" set forth in the appended claims, and the ball screw shaft 124a serves as one example of "first drive shaft" or "second drive shaft" set forth in the appended claims. The rails 41 provided on the support frames 4 are additionally used for the second printing unit 2.

The printing segment 122 comprises a solder supply device 122a (see FIG. 6) for supplying solder to an upper surface of the mask 110 and a squeegee 122b (see FIG. 3) for spreading the supplied solder. Specifically, the printing segment 122 is hung down from two rails 121a each provided on the mechanism-section body 121 to extend in the Y direction, in such a manner that it is displaceable in the Y direction along the rails 121a. The printing segment 122 further comprises a squeegee-lifting/lowering driving device 122c (see FIG. 6) for displacing the squeegee 122b in a vertically liftable and lowerable manner. The printing segment 122 is configured to, during the process of spreading the solder supplied to the upper surface of the mask 110, displace the squeegee 122b in the Y direction while keeping press contact between the squeegee 122b and the mask 110. In this manner, the solder is printed on the upper surface of the board through openings provided in the mask 110. The printing segment 122 is further configured such that, when the mechanism-section body 121 is displaced in the Y direction and the R direction, it is displaced in the Y direction and the R direction together with the mechanism-section body 121.

Figure 5:
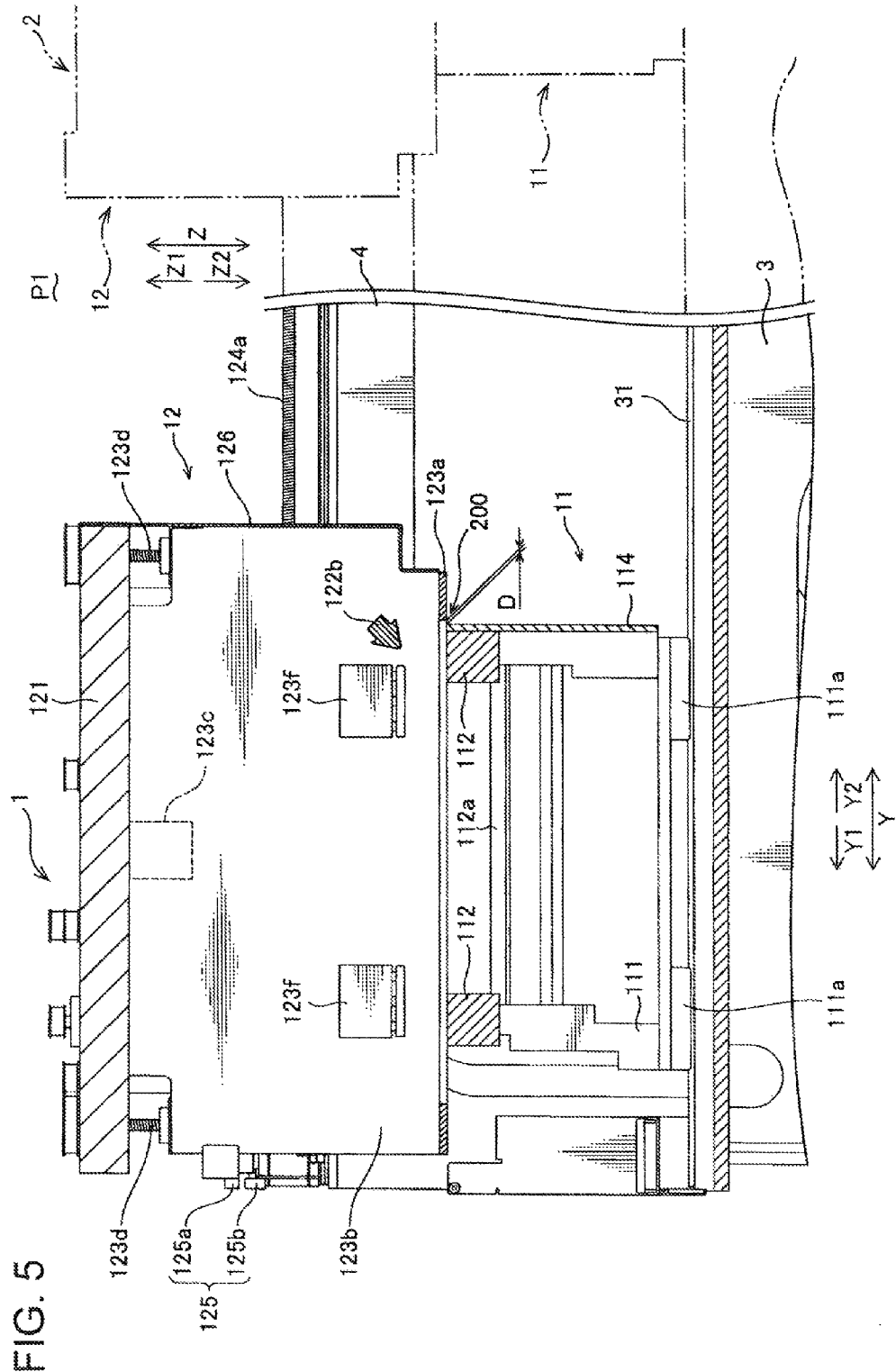
FIG. 5 is a fragmentary sectional view taken along the line V-V in FIG. 3.

The mask support segment 123 is configured to be relatively displaceable with respect to the mechanism-section body 121 in a vertical direction (an upward-downward direction; a Z direction). As illustrated in FIGS. 2 to 5, the mask support segment 123 comprises a mask loading portion 123a for allowing the mask 110 to be placed thereon, and two sidewall portions 123b each connected to a respective one of X-directionally opposite ends of the mask loading portion 123a. The mask loading portion 123a is formed in a hollow, generally-rectangular shape (generally rectangular frame shape) in top plan view. The two sidewall portions 123b are fixedly connected to the mask loading portion 123a. As illustrated in FIGS. 2 and 5, four ball screw shafts 123d are provided, respectively, at four corners of the mechanism-section body 121 in top plan view. The ball screw shafts 123d are configured to be rotationally driven by a mask vertical driving device 123c composed of a servomotor. Specifically, as illustrated in FIG. 2, the four ball screw shafts 123d are configured to be rotationally driven in synchronous relation to each other using a transmission belt 123e by a driving force of one mask vertical driving device 123c. The mask support segment 123 is configured to be relatively displaced vertically with respect to the mechanism-section body 121 as the ball screw shafts 123d are rotationally driven. Based on the above configuration, the mask support segment 123 can be relatively displaced both horizontally (in the Y direction and the R direction) and vertically (in the Z direction) with respect to the board conveying section 11. In this embodiment, the mask vertical driving device 123c serves as one example of "driving source" set forth in the appended claims.

As illustrated in FIGS. 2, 3 and 5, two air cylinders 123f are attached to each of the two sidewall portions 123b. The four air cylinders 123f are provided to press and lock a mask 110 (see FIG. 3) placed on the mask loading portion 123a, from thereabove.

Further, two position sensors 125 each composed of a magnetic sensor are provided on respective ones of the X-directionally opposite ends of the printing mechanism section 12. Each of the two position sensors 125 is provided adjacent to an extension line of a respective one of the ball screw shafts 124a disposed on the X-directionally opposite sides of the printing mechanism section 12. Each of the position sensors 125 is composed of two elements, wherein one element 125a is fixedly attached to one of the sidewall portions 123b of the mask support segment 123, and the other element 125b is fixedly attached to a corresponding one of the support frames 4. The position sensor 125 is configured to be capable of sensing both vertical and horizontal positions. Specifically, the position sensor 125 is operable to sense a position of the mask support segment 123 in order to detect that the printing mechanism section 12 is located in the aftermentioned machine-setup position. In this embodiment, the position sensor 125 serves as one example of each of "first sensing section" and "first-drive-shaft sensing device" or "second-drive-shaft sensing device" set forth in the appended claims.

As illustrated in FIGS. 2 to 5, the printing mechanism section 12 further includes a mechanical-section cover 126 which covers one side of the printing mechanism section 12 facing to the second printing unit 2 (in the Y2 direction). As with the first printing unit 1, the second printing unit 2 comprises the board conveying section 21 and the printing mechanism section 22, as mentioned above.

Figure 1:
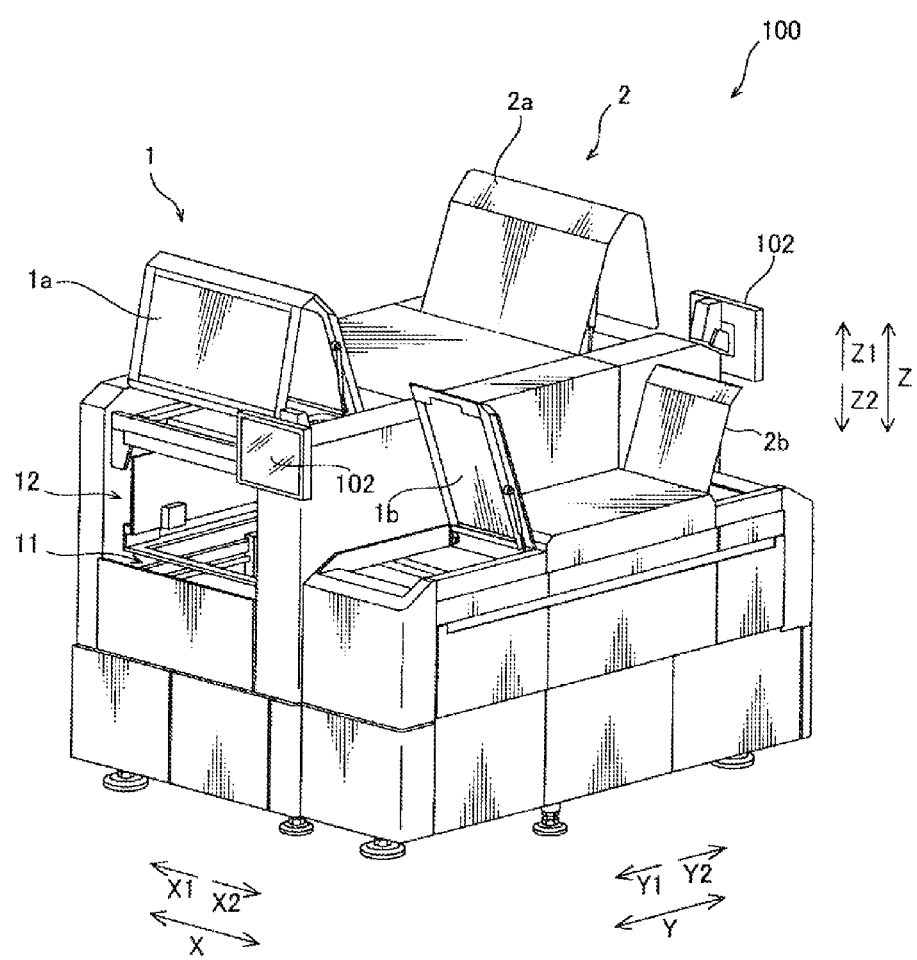
FIG. 1 is a perspective view illustrating a general appearance of a printing machine according to one embodiment of the present invention.

As illustrated in FIG. 1, the first printing unit 1 is provided with an upper opening/closing cover 1a for allowing the board conveying section 11 and the printing mechanism section 12 to be exposed to the outside. The first printing unit 1 is further provided with an openable/closable conveyer cover 1b for allowing the board conveying section 11 to be exposed to the outside. Each of the upper opening/closing cover 1a and the conveyer cover 1b is locked in a closed state when the first printing unit 1 is being operated. Then, only in a given situation, each of the upper opening/closing cover 1a and the conveyer cover 1b is configured to be unlocked and set to an openable state, according to an aftermentioned main control section 101. A user can perform various machine setups, such as a replacement task for the mask 110 or the squeegee 122b, in the state where the upper opening/closing cover 1a is opened. The user can also perform backup machine setups, such as replacement of the support pin for supporting a board, in the state where the conveyer cover 1b is opened. In this embodiment, the upper opening/closing cover 1a serves as one example of "cover section" set forth in the appended claims. As with the first printing device 1, the second printing unit 2 is provided with an upper opening/closing cover 2a and a conveyer cover 2b.

Figure 6:
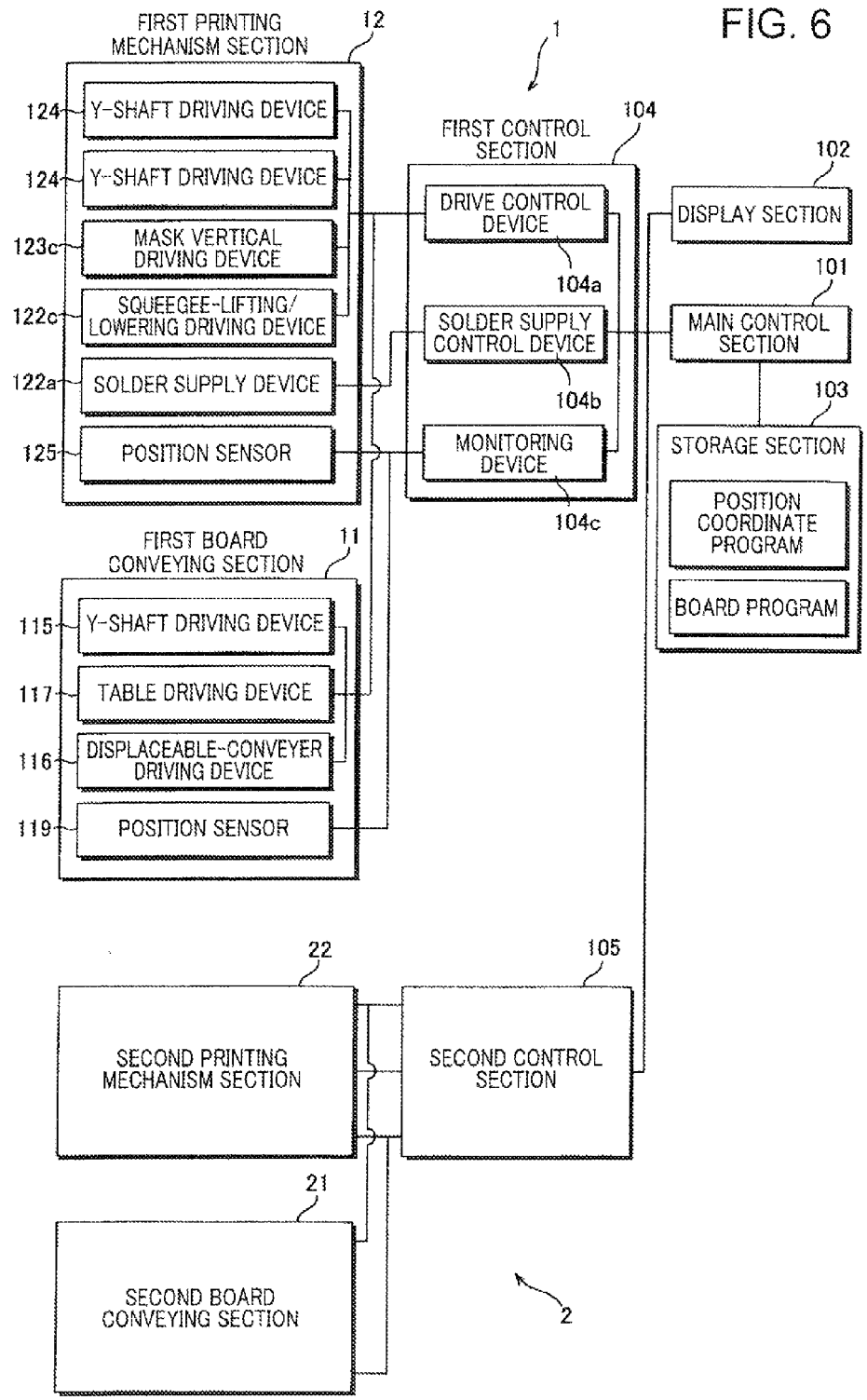
FIG. 6 is a block diagram illustrating an overall configuration of the printing machine according to the embodiment.

With reference to FIG. 6, an internal configuration of the printing machine 100 according to this embodiment will be described below.

As illustrated in FIG. 6, the printing machine 100 comprises a main control section 101 for governing control of the entire printing machine 100, a display section 102, a storage section 103, a first control section 104 for controlling the first printing unit 1, and a second control section 105 for controlling the second printing unit 2. In this embodiment, the main control section 101 serves as one example of "control section" set forth in the appended claims.

The main control section 101 is configured to, based on an instruction from a user, send an instruction signal to each of the first control section 104 and the second control section 105. The display section 102 is provided on a forward side of each of the printing units as illustrated in FIG. 1, and has touch panel functions. The main control section 101 is configured to accept an instruction from a user through the display section 102. The storage section 103 stores therein programs for various operations, together with board data including information such as a board size, and a position coordinate program including positional information of each portion during each of the operations. The main control section 101 is operable to cause the first control section 104 and the second control section 105 to perform a given process based on the board data and the position coordinate program.

The first control section 104 comprises a drive control device 104a, a solder supply control device 104b, and a monitoring device 104c. The drive control device 104a is configured to control respective operations of the Y-shaft driving device 115, the displaceable-conveyer driving device 116 and the table driving device 117 of the board conveying section 11, based on an instruction signal sent from the main control section 101. Further, the drive control device 104a is configured to control respective operations of the squeegee-lifting/lowering driving device 122c, the mask vertical driving device 123c and the Y-shaft driving devices 124 of the printing mechanism section 12, based on the instruction signal sent from the main control section 101. The solder supply control device 104b is configured to control the solder supply device 122a, based on the instruction signal sent from the main control section 101. The monitoring device 104c is configured to acquire sensing results of the position sensor 119 in the board conveying section 11 and the position sensors 125 in the printing mechanism section 12, and transfer the acquired sensing results to the main control section 101. The second control section 105 has the same configuration as that of the first control section 104, and therefore its detailed description will be omitted.

Figure 7:
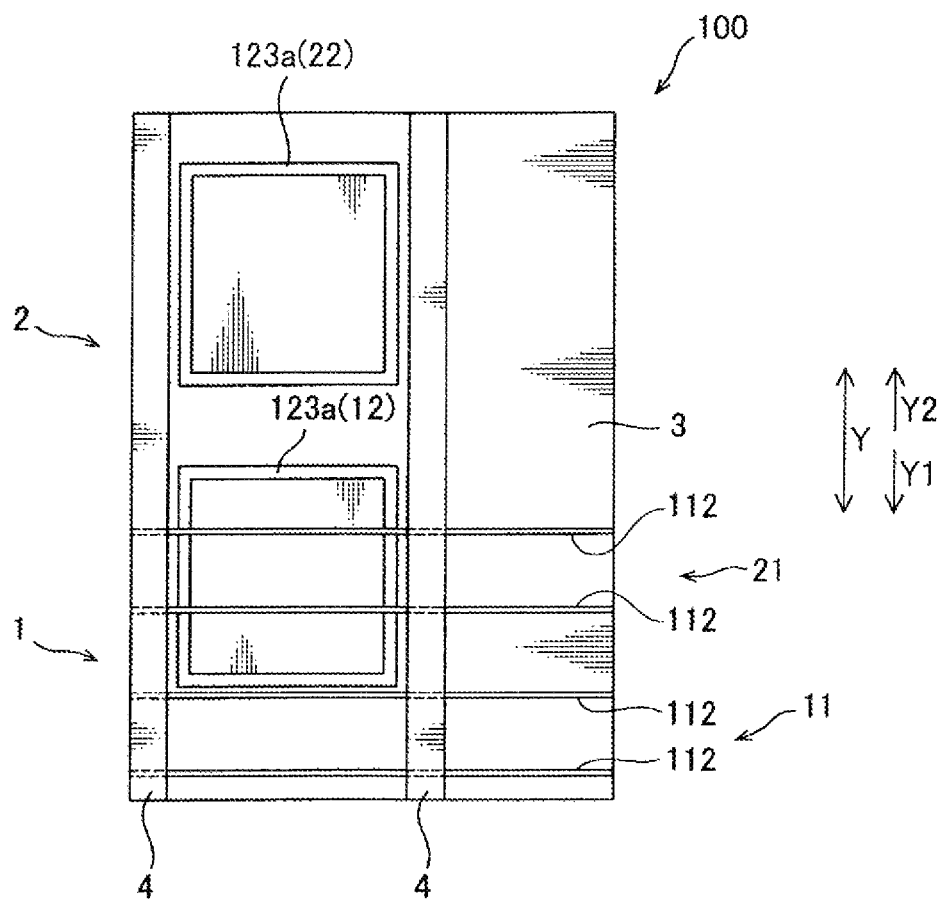
FIG. 7 is a schematic diagram illustrating a state in which one of two printing units in the printing machine according to the embodiment is moved into the other printing unit.

In this embodiment, a working space of the first printing unit 1 and a working space of the second printing unit 2 are not separated from each other by a partition wall or the like. In other words, the working space of the first printing unit 1 and the working space of the second printing unit 2 fluidically communicate with each other. Thus, in the printing machine 100 of this embodiment, the board conveying section 21 of the second printing unit 2 can be displaced in the Y1 direction and moved into the first printing unit 1, as illustrated in FIG. 7. Then, a board supported by the board conveying section 21 can be subjected to a solder printing process using the printing mechanism section 12 of the first printing unit 1. Similarly, the board conveying section 11 of the first printing unit 1 can be displaced in the Y2 direction and moved into the second printing unit 2.

This configuration makes it possible to perform a printing method (printing mode), for example, comprising: subjecting a board supported by a first one 11 (21) of the board conveying sections to a solder printing process using a first one 12 (22) of the printing mechanism sections; displacing the board to the other, second, printing mechanism section 22 (12) while supporting the board by the first board conveying section 11 (22); and subjecting the board to an additional solder printing process using the second printing mechanism section 22 (12). Thus, two-layer printing can be easily performed.

Figure 8:
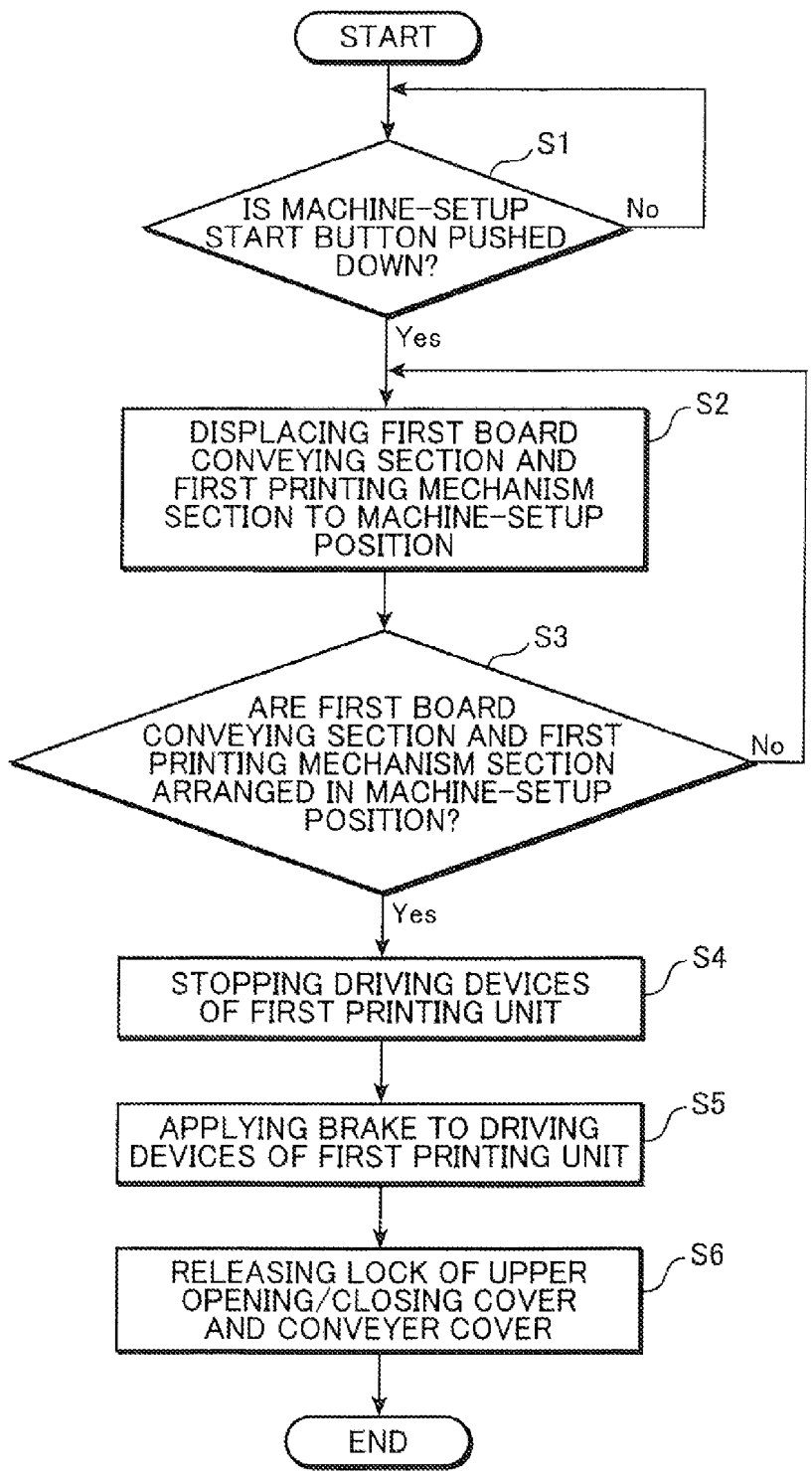
FIG. 8 is a flowchart illustrating a process during machine setup, in the printing machine according to the embodiment.

With reference to FIG. 8, a process during machine setup in the printing machine 100 according to the embodiment will be described below. The following description will be made about a process during machine setup for the first printing unit. A process during machine setup for the second printing unit is the same as that for the first printing unit, and therefore its detailed description will be omitted. In the printing machine 100 according to this embodiment, during machine setup for the first printing unit, a normal operation, such as a printing operation, of the second printing unit 2, can be continuously performed. In other words, the printing machine 100 is configured such that the first printing unit 1 can perform a process during machine setup, while allowing the second printing unit 2 to continuously perform a normal operation.

In Step S1, the main control section 101 determines whether a machine-setup start button is pushed down by a user. The machine-setup start button is displayed on the touch panel type display section 102. If YES, in Step S2, the main control unit 101 operates to displace the board conveying section 11 and the printing mechanism section 12 to a machine-setup position. As used here, the term "machine-setup position" means a predetermined fixed position ("P1": see FIGS. 4 and 5) in which the board conveying section 11 and the printing mechanism section 12 are to be arranged during machine setup for the first printing unit 1. When the board conveying section 11 and the printing mechanism section 12 are arranged in the machine-setup position, a maximum distance D of a gap 200 (see FIGS. 4 and 5) defined between the board conveying section 11 and the printing mechanism section 12 and leading from the first printing unit 1 to the second printing unit 2 becomes equal to a given value (e.g., 4 mm). More specifically, as illustrated in FIGS. 4, 5, 9 and 10, the gap 200 between the board conveying section 11 and the printing mechanism section 12 is a gap defined between the conveying-section cover 114 of the board conveying section 11 and the mask loading portion 123a of the printing mechanism section 12. In this embodiment, the sides of the board conveying section 11 and the printing mechanism section 12 facing to the second printing unit 2 are covered by the conveying-section cover 114 and the mechanical-section cover 126, respectively. Thus, a gap leading from the first printing unit 1 to the second printing unit 2 is substantially only a gap between the conveying-section cover 114 of the board conveying section 11 and the mask loading portion 123a of the printing mechanism section 12.

The main control section 101 operates to control the Y-shaft driving device 115 of the board conveying section 11 through the first control section 104 to thereby displace the board conveying section 11 to the machine-setup position. Concurrently, the main control section 101 operates to control the mask vertical driving device 123c and the two Y-shaft driving devices 124 through the first control section 104 to thereby displace the printing mechanism section 12 to the machine-setup position. More specifically, the main control section 101 operates to displace the mask support segment 123 of the printing mechanism section 12 both vertically and horizontally to thereby displace the printing mechanism section 12 to the machine-setup position.

Figure 9:
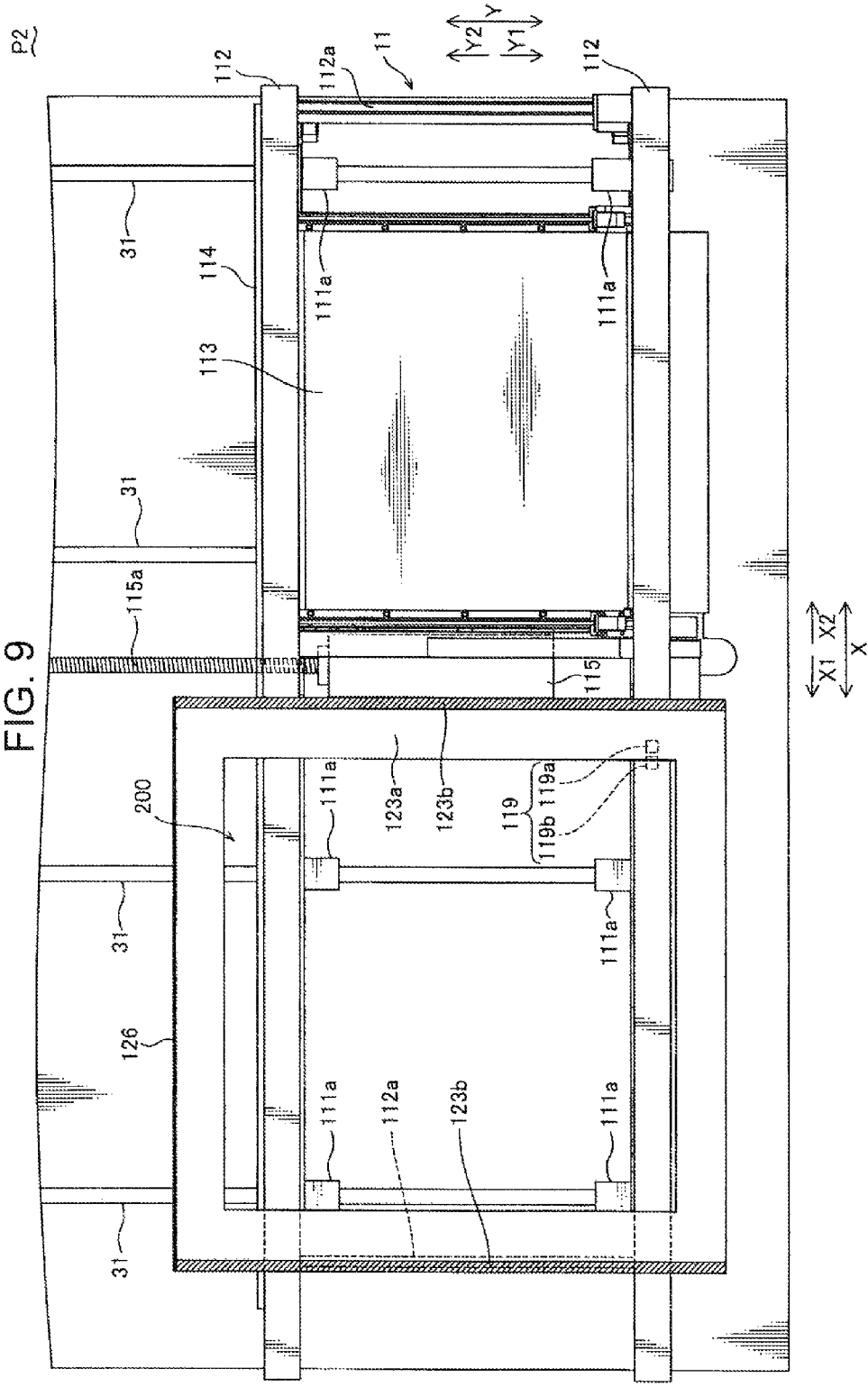
FIG. 9 is a schematic top plan view illustrating a gap leading to a second printing unit, in the printing machine according to the embodiment.
Figure 10:
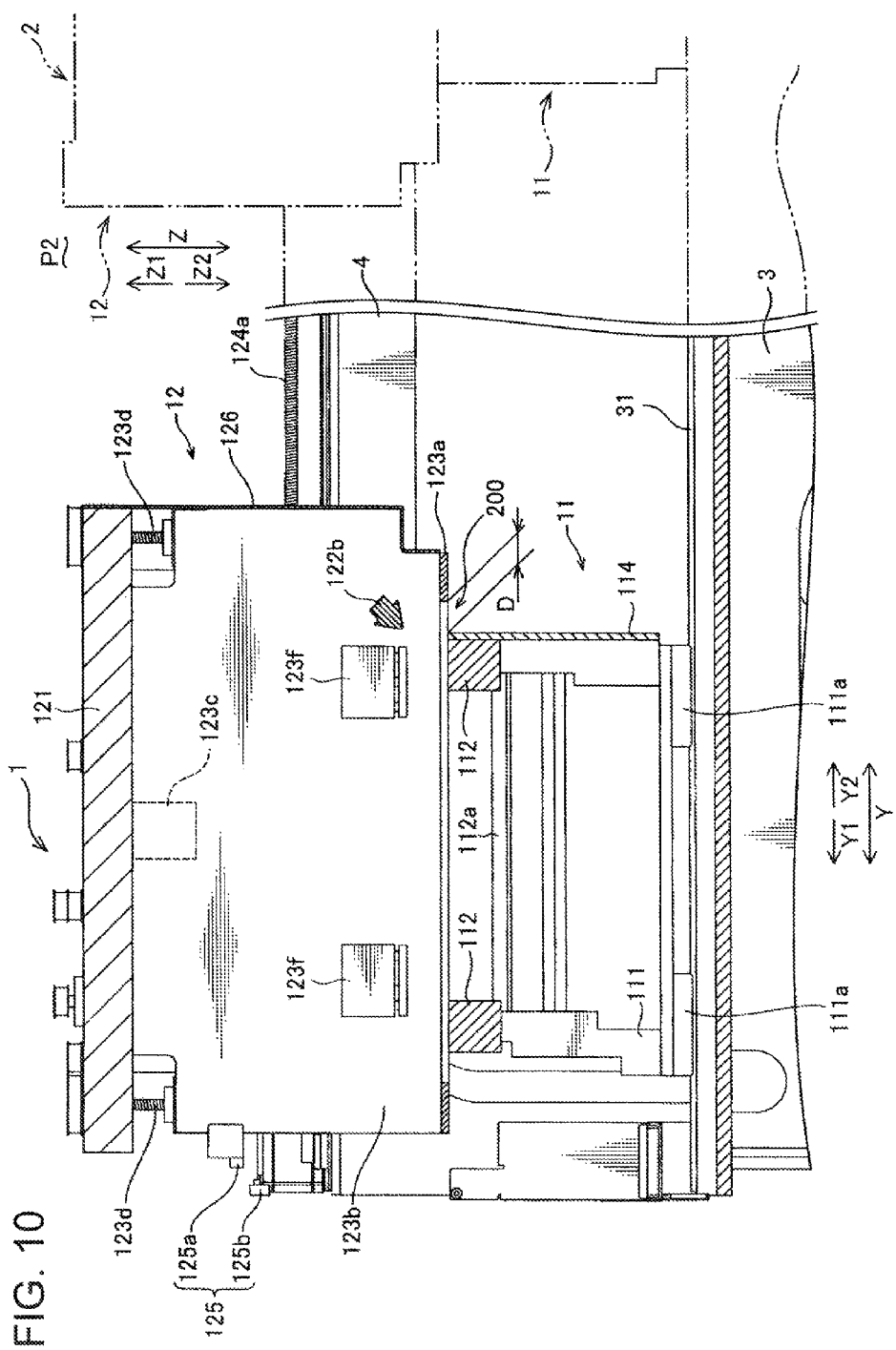
FIG. 10 is a schematic sectional view illustrating the gap leading to the second printing unit, in the printing machine according to the embodiment.

Then, in Step S3, the main control section 101 operates to, based on a sensing result of the position sensor 119 of the board conveying section 11, determine whether the board conveying section 11 is arranged in the machine-setup position, and further operates to, based on sensing results of the position sensors 125 of the printing mechanism section 12, determine whether the printing mechanism section 12 is arranged in the machine-setup position. The main control section 101 operates to repeat the operations in Steps S2 and S3 until the board conveying section 11 and the printing mechanism section 12 are arranged in the machine-setup position. If at least one of the board conveying section 11 and the printing mechanism section 12 is not arranged in the machine-setup position (i.e., non-machine-setup position referenced with "P2" as shown in FIGS. 9 and 10), the maximum distance D of the gap 200 between the board conveying section 11 and the printing mechanism section 12 becomes greater than the given value, as illustrated in FIGS. 9 and 10.

When the board conveying section 11 and the printing mechanism section 12 are arranged in the machine-setup position, the main control section 101 operates to shift the process to Step S4. Specifically, when the maximum distance D of the gap 200 becomes equal to a given value (e.g., 4 mm), the main control section 101 operates to stop drivings of the driving devices of the first printing unit 1 through the first control section 104, in Step S4. More specifically, the main control section 101 operates to stop drivings of the Y-shaft driving device 115, the displaceable-conveyer driving device 116 and the table driving device 117 of the board conveying section 11, and further operates to stop drivings of the squeegee-lifting/lowering driving device 122c, the mask vertical driving device 123c and the two Y-shaft driving devices 124 of the printing mechanism section 12. Then, in Step S5, the main control section 101 operates to perform control to apply brake to the stopped driving devices. Specifically, the main control section 101 operates to apply brake to the Y-shaft driving device 115, the displaceable-conveyer driving device 116 and the table driving device 117 of the board conveying section 11, and the squeegee-lifting/lowering driving device 122c, the mask vertical driving device 123c and the two Y-shaft driving devices 124 of the printing mechanism section 12. This makes it possible to prevent the board conveying section 11 and the printing mechanism section 12 from being misaligned with respect to the machine-setup position. Then, in Step S6, the main control section 101 operates to perform control to release the lock of the upper opening/closing cover 1a and the conveyer cover 1b. This allows a user to open the upper opening/closing cover 1a and the conveyer cover 1b so as to perform machine setup for the first printing unit 1.

When the user opens the upper opening/closing cover 1a after completion of the above process, the maximum distance D of the gap 200 defined between the board conveying section 11 and the printing mechanism section 12 and leading to the second printing unit 2 is set to a given value (e.g., 4 mm).

As described above, in the above embodiment, when machine setup for the first printing unit 1 is performed during operation of the second printing unit 2, the board conveying section 11 and the printing mechanism section 12 are arranged in the machine-setup position, i.e., a position where the maximum distance D of the gap 200 defined between the board conveying section 11 and the printing mechanism section 12 and leading to the second printing unit 2 becomes equal to a given value (e.g., 4 mm), under control of the main control section 101. In this manner, the maximum distance D of the gap 200 leading from the first printing unit 1 to the second printing unit 2 is automatically set to a given value (e.g., 4 mm), so that it becomes possible to reduce an area of the first printing unit 1 which causes exposure of the second printing unit 2 during machine setup for the first printing unit 1. Thus, in the printing machine 100 according to the above embodiment, the second printing unit 2 can be continuously operated even if respective working spaces of the first and second printing units are not separated from each other, so that it becomes possible to suppress deterioration in production efficiency during machine setup for the first printing unit 1, while enhancing the flexibility in working mode.

In the above embodiment, when machine setup for the first printing unit 1, under control of the main control section 101, the mask support segment 123 of the printing mechanism section 12 is relatively displaced vertically and horizontally with respect to the board conveying section 11 to allow the board conveying section 11 and the printing mechanism section 12 to be arranged in the machine-setup position. According to this configuration, the mask support segment 123 of the printing mechanism section 12 can be relatively displaced both vertically and horizontally with respect to the board conveying section 11 to allow the maximum distance D of the gap 200 between the board conveying section 11 and the printing mechanism section 12 to be set to a given value (e.g., 4 mm), which makes it possible to easily reduce the gap 200 between the board conveying section 11 and the printing mechanism section 12.

In the above embodiment, the main control section 101 is operable, based on a sensing result of the position sensor 125 for sensing a position of the mask support segment 123 of the printing mechanism section 12, to determine whether the board conveying section 11 and the printing mechanism section 12 are arranged in the machine-setup position. According to this configuration, based on an actual position of the mask support segment 123 sensed by the position sensor 125, the main control section 101 determines whether the board conveying section 11 and the printing mechanism section 12 are arranged in the machine-setup position, which makes it possible to improve accuracy of the determination.

In the above embodiment, the main control section 101 is operable, based on sensing results of the two position sensors 125 provided on respective ones of the X-directionally opposite ends of the printing mechanism section 12, to determine whether the board conveying section 11 and the printing mechanism section 12 are arranged in the machine-setup position. According to this configuration, even in a situation where the mask support segment 123 of the printing mechanism section 12 is rotated in a horizontal plane with respect to the board conveying section 11 and posturally changed due to a difference between displacement amounts at the X-directionally opposite ends of the printing mechanism section 12, whether the board conveying section 11 and the printing mechanism section 12 are arranged in the machine-setup position in an appropriate posture can be determined based on the sensing results of the two position sensors 125.

In the above embodiment, the position sensor 125 is configured to sense both vertical and horizontal positions of the mask support segment 123. According to this configuration, it is possible to eliminate a need for providing a sensing device for sensing a vertical position of the mask support segment 123 of the printing mechanism section 12 and a sensing device for sensing a horizontal position of the mask support segment 123, separately, which makes it possible to suppress an increase in the number of components.

In the above embodiment, the main control section 101 is operable, based on sensing results of both of the position sensor 125 and the position sensor 119, to determine whether the board conveying section 11 and the printing mechanism section 12 are arranged in the machine-setup position. According to this configuration, based on an actual position of the printing mechanism section 12 sensed by the position sensor 125 and an actual position of the board conveying section 11 sensed by the position sensor 119, a relative position between the board conveying section 11 and the printing mechanism section 12 can be accurately figured out by the main control section 101. This makes it possible to more accurately determine whether the board conveying section 11 and the printing mechanism section 12 are arranged in the machine-setup position.

In the above embodiment, the main control section 101 is operable, when the machine setup for the first printing unit 1 is performed, to perform control to activate a driving source (the mask vertical driving device 123c and the Y-shaft driving devices 124) of the printing mechanism section 12 to allow the board conveying section 11 and the printing mechanism section 12 to be arranged in the machine-setup position, and then apply brake to the driving source. According to this configuration, when the machine setup for the first printing unit 1 is performed, after the board conveying section 11 and the printing mechanism section 12 are displaced to the machine-setup position, a displacement of the printing mechanism section 12 is restrained, which makes it possible to prevent the printing mechanism section 12 from being misaligned with respect to the machine-setup position.

In the above embodiment, the main control section 101 is operable, when the board conveying section 11 and the printing mechanism section 12 are arranged in the machine-setup position, to release the lock of the upper opening/closing cover 1a and the conveyer cover 1b so as to allow machine setup for the first printing unit 1 to be performed. According to this configuration, it becomes possible to reliably prevent the occurrence of a situation where the machine setup is started even though the board conveying section 11 and the printing mechanism section 12 have not been arranged in the machine-setup position, i.e., the gap 200 between the board conveying section 11 and the printing mechanism section 12 is still greater than the given value.

It should be understood that the above embodiment has been described by way of illustration only, and not by way of limitation. The scope of the invention is not limited by the description of the above embodiment but determined by the appended claims. Further, the invention is intended to cover all changes and modifications thereof which are included in the scope of the appended claims and their legal equivalents.

For example, although the above embodiment has been described by taking a printing machine as one example of a printed circuit board production apparatus of the present invention, the present invention is not limited thereto. The present invention may be applied to any printed circuit board production apparatus other than a printing machine, such as a component mounting apparatus.

Although the above embodiment has been described based on an example where both of the first printing unit 1 (first working unit) and the second printing unit 2 (second working unit) are controlled by the main control section 101 serving as "control section" set forth in the appended claims, the present invention is not limited thereto. For example, two control sections may be provided for respective ones of the first and second working units, and configured to perform the process during machine setup illustrated in FIG. 8 separately.

Although the above embodiment has been described based on an example where, when machine setup for the first printing unit 1 (first working unit) is performed, both of the board conveying section 11 and the printing mechanism section 12 (working mechanism section) are displaced to the machine-setup position, the present invention is not limited thereto. For example, only one of the board conveying section and the working mechanism section may be configured to be displaceable, wherein, when machine setup for the first working unit is performed, a displaceable one of the board conveying section and the working mechanism section may be displaced to the machine-setup position. As a specific example, only the working mechanism section (printing mechanism section) may be displaced to the machine-setup position without displacing the board conveying section.

Although the above embodiment has been described using a flow driven-type flowchart in which operations of the main control section serving as "control section" set forth in the appended claims are sequentially performed according to a process flow, the present invention is not limited thereto. For example, the control section may be operated based on an event driven-type process in which an operation is executed on an event-by-event basis. In this case, the control section may be operated based on only the event driven-type process or may be operated based on a combination of the event driven-type process and the flow driven-type process.

The outline of the present invention is as follows.

According to one aspect of the present invention, there is provided a printed circuit board production apparatus which comprises a first working unit, a second working unit disposed adjacent to the first working unit, and a control section for controlling an operation of the first working unit. The first working unit includes a board conveying section for conveying a board, and a working mechanism section for subjecting the board conveyed by the board conveying section to a given working process, wherein the board conveying section and the working mechanism section are configured to be relatively displaceable between a machine-setup position where a gap defined between the board conveying section and the working mechanism section and leading to the second working unit becomes equal to or less than a given value, and a position where the gap becomes greater than the given value. The control section is operable, when machine setup for the first working unit is performed during operation of the second working unit, to displace at least one of the board conveying section and the working mechanism section to allow the board conveying section and the working mechanism section to be arranged in the machine-setup position.

In the printed circuit board production apparatus of the present invention, when machine setup for the first working unit is performed during operation of the second working unit, a displacement of at least one of the board conveying section and the working mechanism section is controlled by the control section to allow the board conveying section and the working mechanism section to be arranged in the machine-setup position. Therefore, the gap leading from the first working unit to the second working unit is automatically set to a given value or less, so that it becomes possible to reduce an area of the first working unit which causes exposure of the second working unit during machine setup for the first working unit. Thus, the second working unit can be continuously operated even if respective working spaces of the first and second working units are not separated from each other, so that it becomes possible to suppress deterioration in production efficiency during machine setup for the first working unit, while enhancing the flexibility in working mode.

Preferably, in the printed circuit board production apparatus of the present invention, the working mechanism section includes a displaceable segment configured to be relatively displaceable vertically and horizontally with respect to the board conveying section, wherein the gap is defined between the displaceable segment and the board conveying section, and the machine-setup position corresponds to a position where the displaceable segment is arranged to allow the gap to become equal to or less than the given value, and wherein the control section is operable, when the machine setup for the first working unit is performed, to relatively displace the displaceable segment vertically and horizontally with respect to the board conveying section to allow the board conveying section and the working mechanism section to be arranged in the machine-setup position.

According to this feature, the displaceable segment can be relatively displaced both vertically and horizontally with respect to the board conveying section to allow the gap between the board conveying section and the working mechanism section to be set to the given value or less, which makes it possible to easily reduce the gap between the board conveying section and the working mechanism section.

Preferably, the above printed circuit board production apparatus further comprises a first sensing section for sensing a position of the displaceable segment, wherein the control section is operable, based on a sensing result of the first sensing section, to determine whether the board conveying section and the working mechanism section are arranged in the machine-setup position.

According to this feature, based on an actual position of the displaceable segment (working mechanism section) sensed by the first sensing section, the control section can determine whether the board conveying section and the working mechanism section are arranged in the machine-setup position, which makes it possible to improve accuracy of the determination.

Preferably in the above printed circuit board production apparatus, the displaceable segment is configured to be displaced horizontally according to drivings of a first drive shaft and a second drive shaft arranged in parallel to each other, wherein: the first sensing section includes a first-drive-shaft sensing device disposed correspondingly to the first drive shaft, and a second-drive-shaft sensing device disposed correspondingly to the second drive shaft; and the control section is operable, based on sensing results of both of the first-drive-shaft sensing device and the second-drive-shaft sensing device, to determine whether the board conveying section and the working mechanism section are arranged in the machine-setup position.

According to this feature, even in a situation where the displaceable segment is rotated in a horizontal plane with respect to the board conveying section and posturally changed due to a difference between driving amounts of the first drive shaft and the second drive shaft, whether the board conveying section and the working mechanism section are arranged in the machine-setup position in an appropriate posture can be determined based on the sensing results of two sensing devices consisting of the first-drive-shaft sensing device and the second-drive-shaft sensing device.

Preferably, in the printed circuit board production apparatus having the first sensing section, the first sensing section is configured to sense both vertical and horizontal positions of the displaceable segment.

According to this feature, it is possible to eliminate a need for providing a sensing device for sensing a vertical position of the displaceable segment and a sensing device for sensing a horizontal position of the displaceable segment, separately, which makes it possible to suppress an increase in the number of components.

Preferably, the printed circuit board production apparatus having the first sensing section further comprises a second sensing section for sensing a position of the board conveying section, wherein the control section is operable, based on sensing results of both of the first sensing section and the second sensing section, to determine whether the board conveying section and the working mechanism section are arranged in the machine-setup position.

According to this feature, based on an actual position of the displaceable segment sensed by the first sensing section and an actual position of the board conveying section sensed by the second sensing section, a relative position between the board conveying section and the displaceable segment can be accurately figured out, so that it becomes possible to more accurately determine whether the board conveying section and the working mechanism section are arranged in the machine-setup position.

Preferably, the printed circuit board production apparatus having the first sensing section further comprises a driving source for relatively displacing the displaceable segment with respect to the board conveying section, wherein the control section is operable, when the machine setup for the first working unit is performed, to perform control to activate the driving source to allow the board conveying section and the displaceable segment to be arranged in the machine-setup position, and then apply brake to the driving source.

According to this feature, when the machine setup for the first working unit is performed, after the board conveying section and the working mechanism section are arranged in the machine-setup position, a displacement of the displaceable segment is restrained, which makes it possible to prevent the working mechanism section from being misaligned with respect to the machine-setup position.

Preferably, in the printed circuit board production apparatus having the first sensing section, the control section is operable, when the board conveying section and the working mechanism section are not arranged in the machine-setup position, to perform control to restrain the machine setup for the first working unit, and, when the board conveying section and the working mechanism section are arranged in the machine-setup position, to perform control to release the restraint.

According to this feature, it becomes possible to prevent the occurrence of a situation where machine setup for the first working unit is started even though the board conveying section and the working mechanism section have not been arranged in the machine-setup position, i.e., the gap between the board conveying section and the working mechanism section is still greater than the given value.

In a specific embodiment, the above printed circuit board production apparatus further comprises a cover section capable of being opened and closed between an opened state for allowing the board conveying section and the working mechanism section to be exposed to an outside, and a closed state for allowing the board conveying section and the working mechanism section to be shielded from the outside, wherein the control section is operable, when the board conveying section and the working mechanism section are not arranged in the machine-setup position, to lock the cover section in the closed state, and, when the board conveying section and the working mechanism section are arranged in the machine-setup position, to release the lock of the cover section.

According to this feature, the locked state of the cover section is controlled based on whether or not the board conveying section and the working mechanism section are arranged in the machine-setup position. This makes it possible to reliably prevent the occurrence of the situation where the machine setup is started even though the board conveying section and the working mechanism section have not been arranged in the machine-setup position.

According to another aspect of the present invention, there is provided a printing machine which comprises a first printing unit, a second printing unit disposed adjacent to the first printing unit, and a control section for controlling an operation of the first printing unit. The first printing unit includes a board conveying section for conveying a board, and a printing mechanism section for subjecting the board conveyed by the board conveying section to a given printing process, wherein the board conveying section and the printing mechanism section are configured to be relatively displaceable between a machine-setup position where a gap defined between the board conveying section and the printing mechanism section and leading to the second printing unit becomes equal to or less than a given value, and a position where the gap becomes greater than the given value. The control section is operable, when machine setup for the first printing unit is performed during operation of the second printing unit, to displace at least one of the board conveying section and the printing mechanism section to allow the board conveying section and the printing mechanism section to be arranged in the machine-setup position.

In the printing machine of the present invention, when machine setup for the first printing unit is performed during operation of the second printing unit, a displacement of at least one of the board conveying section and the printing mechanism section is controlled by the control section to allow the board conveying section and the printing mechanism section to be arranged in the machine-setup position. Therefore, the gap leading from the first printing unit to the second printing unit is automatically set to a given value or less, so that it becomes possible to reduce an area of the first printing unit which causes exposure of the second printing unit during machine setup for the first printing unit. Thus, the second printing unit can be continuously operated even if respective working spaces of the first and second printing units are not separated from each other, so that it becomes possible to suppress deterioration in production efficiency during machine setup for the first printing unit, while enhancing the flexibility in working mode.

This application is based on Japanese Patent application No. 2011-106220 filed in Japan Patent Office on May 11, 2011, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A printing machine comprising:
a first printing unit and a second printing unit that are disposed adjacent to each other in a first direction; and
a control section configured to control an operation of the first printing unit,
wherein:
the first printing unit includes a board conveying section for conveying a board in a second direction orthogonal to the first direction, and a printing mechanism section disposed above the board conveying section for subjecting the board conveyed by the board conveying section to a given printing process,
the board conveying section includes a conveyer extending in the second direction for board conveyance, a conveying-section body for supporting the conveyer, and a conveying-section cover which is provided on a side surface of the conveying-section body and the conveyer covers one side of the board conveying section facing to the second printing unit,
the printing mechanism section includes a mask support segment which supports a mask, a printing segment which is located above the mask and has a squeegee for spreading solder on an upper surface of the mask, and a mechanical-section cover which is attached to a side surface of the mask support segment and covers one side of the printing mechanism section facing to the second printing unit,
the board conveying section and the mask support segment being configured to be relatively displaceable between a machine-setup position where one side of the first printing unit facing to the second printing unit is covered by the mechanical-section cover, the mask support segment and the conveying-section cover by setting a gap defined between the conveying-section cover leading to the second printing unit and the mask support segment becomes equal to or less than a given value to reduce an exposure area between the first print unit and the second print unit, and a position where the gap becomes greater than the given value, in the first direction; and
the control section is configured, when machine setup for the first printing unit is performed during operation of the second printing unit, to displace the board conveying section and the mask support segment relatively to allow the board conveying section and the mask support segment to be arranged in the machine-setup position.

2. The printing machine as defined in claim 1, wherein
the mask support segment is configured to be relatively displaceable vertically and horizontally with respect to the board conveying section,
and
the control section is configured, when the machine setup for the first printing unit is performed, to relatively displace the mask support segment vertically and horizontally with respect to the board conveying section to allow the board conveying section and the mask support segment to be arranged in the machine-setup position.

3. The printing machine as defined in claim 2, which further comprises a first sensing section for sensing a position of the mask support segment, wherein the control section is configured, based on a sensing result of the first sensing section, to determine whether the board conveying section and the mask support segment are arranged in the machine-setup position.

4. The printing machine as defined in claim 3, wherein the mask support segment is configured to be displaced horizontally according to drivings of a first drive shaft and a second drive shaft arranged in parallel to each other, and wherein:
the first sensing section includes a first-drive-shaft sensing device disposed correspondingly to the first drive shaft, and a second-drive-shaft sensing device disposed correspondingly to the second drive shaft; and
the control section is configured, based on sensing results of both of the first-drive-shaft sensing device and the second-drive-shaft sensing device, to determine whether the board conveying section and the mask support segment are arranged in the machine-setup position.

5. The printing machine as defined in claim 3, wherein the first sensing section is configured to sense both vertical and horizontal positions of the mask support segment.

6. The printing machine as defined in claim 3, which further comprises a second sensing section for sensing a position of the board conveying section, wherein the control section is configured, based on sensing results of both of the first sensing section and the second sensing section, to determine whether the board conveying section and the mask support segment are arranged in the machine-setup position.

7. The printing machine as defined in claim 3, which further comprises a driving source for relatively displacing the mask support segment with respect to the board conveying section, wherein the control section is configured, when the machine setup for the first printing unit is performed, to perform control to activate the driving source to allow the board conveying section and the mask support segment to be arranged in the machine-setup position, and then apply brake to the driving source.

8. The printing machine as defined in claim 3, which further comprises a cover section capable of being opened and closed between an opened state for allowing the board conveying section and the printing mechanism section to be exposed to an outside, and a closed state for allowing the board conveying section and the printing mechanism section to be shielded from the outside, wherein the control section is configured, when the board conveying section and the mask support segment are not arranged in the machine-setup position, to lock the cover section in the closed state, and, when the board conveying section and the mask support segment are arranged in the machine-setup position, to release the lock of the cover section.

9. The printing machine as defined in claim 1, wherein
when the board conveying section and the printing mechanism section of the first printing unit are defined as a first board conveying section and a first printing mechanism section,
the second printing unit includes a second board conveying section which is displaceable to the first direction and which conveys a board in a second direction, and a printing mechanism section disposed above the second board conveying section for subjecting the board conveyed by the second board conveying section to a given printing process, and
the first printing unit is displaceable between a position where the board supported by the first board conveying section is subjectable to a printing process using the first printing mechanism section, and a position where the board supported by the first board conveying section is subjectable to a printing process using the second printing mechanism section.

\* \* \* \* \*